United States Patent
Liu

(10) Patent No.: US 9,454,430 B2
(45) Date of Patent: Sep. 27, 2016

(54) METHOD FOR CONTROLLING MEMORY APPARATUS, AND ASSOCIATED MEMORY APPARATUS AND CONTROLLER THEREOF

(71) Applicant: Silicon Motion Inc., Hsinchu County (TW)

(72) Inventor: Zhen-U Liu, Taoyuan (TW)

(73) Assignee: Silicon Motion Inc., Hsinchu County (TW)

( * ) Notice: Subject to any disclaimer, the term of this patent is extended or adjusted under 35 U.S.C. 154(b) by 30 days.

(21) Appl. No.: 14/642,760

(22) Filed: Mar. 10, 2015

(65) Prior Publication Data
US 2015/0363265 A1    Dec. 17, 2015

(30) Foreign Application Priority Data

Jun. 17, 2014   (TW) .............................. 103120894 A

(51) Int. Cl.
| | |
|---|---|
| H03M 13/00 | (2006.01) |
| G06F 11/10 | (2006.01) |
| H03M 13/11 | (2006.01) |
| H03M 13/35 | (2006.01) |

(52) U.S. Cl.
CPC ....... *G06F 11/1068* (2013.01); *G06F 11/1072* (2013.01); *H03M 13/116* (2013.01); *H03M 13/35* (2013.01); *H03M 13/6516* (2013.01)

(58) Field of Classification Search
None
See application file for complete search history.

(56) References Cited

U.S. PATENT DOCUMENTS

| | | | |
|---|---|---|---|
| 8,145,987 B2 | 3/2012 | Shen | |
| 2005/0283709 A1* | 12/2005 | Kyung | ................. H03M 13/116 714/758 |
| 2006/0156169 A1* | 7/2006 | Shen | ................. H03M 13/1148 714/752 |
| 2007/0033480 A1* | 2/2007 | Lee | ........................ H03M 13/11 714/758 |
| 2008/0082897 A1 | 4/2008 | Brandman | |
| 2010/0088573 A1* | 4/2010 | Lakkis | ............. H03M 13/6393 714/758 |
| 2010/0122140 A1* | 5/2010 | Shen | ................. H03M 13/1148 714/752 |
| 2011/0239080 A1 | 9/2011 | Sakaue | |
| 2013/0254628 A1 | 9/2013 | Kim | |
| 2014/0164875 A1* | 6/2014 | Kim | .................... G06F 11/1012 714/764 |

FOREIGN PATENT DOCUMENTS

| | | |
|---|---|---|
| TW | 201106368 A1 | 2/2011 |
| TW | 201126527 A1 | 8/2011 |
| TW | 201331940 A1 | 8/2013 |

* cited by examiner

*Primary Examiner* — M. Mujtaba Chaudry
(74) *Attorney, Agent, or Firm* — Winston Hsu; Scott Margo

(57) ABSTRACT

A method for controlling a memory apparatus and the associated memory apparatus thereof and the associated controller thereof are provided, where the method includes: reading encoded data of a second set of error correction configuring parameters from a system block, and utilizing an LDPC engine to decode the encoded data to obtain the second set of error correction configuring parameters, where the LDPC engine stores a first set of error correction configuring parameters, and during decoding the encoded data, the LDPC engine performs decoding corresponding to a first LDPC characteristic matrix based on the first set of error correction configuring parameters; and controlling the LDPC engine to perform operations corresponding to a second LDPC characteristic matrix based on the second set of error correction configuring parameters in RAM, in order to make the LDPC engine be equipped with new encoding and decoding capabilities corresponding to the second LDPC characteristic matrix.

20 Claims, 7 Drawing Sheets

METHOD FOR CONTROLLING MEMORY APPARATUS, AND ASSOCIATED MEMORY APPARATUS AND CONTROLLER THEREOF

BACKGROUND OF THE INVENTION

1. Field of the Invention

The present invention relates to controlling the error correction ability of a flash memory apparatus, and more particularly, to a method arranged for controlling a memory apparatus and associated memory apparatus and controller thereof 2. Description of the Prior Art With the rapid development of the flash memory in recent years, various portable memory apparatuses (e.g., memory cards conforming to the SD/MMC, CF, MS and XD standards) are widely applied in a variety of applications. Hence, how to control the access of flash memories in the portable memory apparatuses has gradually become an important issue.

Taking usual NAND flash memories as example, the NAND flash memories may be divided into single-level cell (SLC) and multi-level cell (MLC) flash memories. Each of the transistors in an SLC flash memory that is used as a memory cell only has two electric charge values arranged for representing logic values "0" and "1", respectively. However, the storage capability of each of the transistors in an MLC flash memory that is used as a memory cell is fully used and is driven with higher voltages, so as to record information of a plurality of bits (e.g., 00, 01, 11, and 10). Theoretically, the recording density of the MLC flash memory may exceed twice the recording density of the SLC flash memory. This is good news for manufacturers of NAND flash memories who face a bottleneck during research and development.

Compared with the SLC flash memory, the price of the MLC flash memory is cheaper, and the MLC flash memory may provide larger storage capacity in a limited space. Hence, the MLC flash memories soon become mainstream memories that are applied in portable memory apparatuses on the market. According to related arts, due to the complex operations of some MLC flash memories, the conventional memory controllers need to be equipped with powerful error correction mechanisms, in order to ensure the correctness of user data. However, some issues are thereby generated. For example, different error correction ability requirements and different designs for the controllers of different products make the related cost (e.g., time and material cost) increase correspondingly. Taking existing products on the market as example, when the design of the memory controllers in the released follow-up products need to be changed/modified, the related cost (e.g., time and material cost) will increase correspondingly. Therefore, there is a need for a novel method arranged for enhancing the control of the data access of flash memories, in order to improve the overall performance without introducing undesired side effects (e.g., errors of stored data).

SUMMARY OF THE INVENTION

Hence, an objective of the present invention is to provide a method for controlling a memory apparatus, and an associated memory apparatus and an associated controller, so as to solve the aforementioned issue.

Another objective of the present invention is to provide a method for controlling a memory apparatus, and an associated memory apparatus and an associated controller, so as to apply the same controller chip to different products.

Yet another objective of the present invention is to provide a method for controlling a memory apparatus, and an associated memory apparatus and an associated controller, so as to improve the performance of the memory apparatuses without changing the controller chip.

At least one preferred embodiment of the present invention provides a method for controlling a memory apparatus. The memory apparatus includes at least one non-volatile (NV) memory element, each including a plurality of blocks. The method is applied to a controller in the memory apparatus, and the controller is arranged to control the at least one non-volatile memory element. The method includes following steps: reading encoded data of a second set of error correction configuring parameters from a system block of a specific non-volatile memory element within the at least one non-volatile memory element, and utilizing a low-density parity-check (LDPC) engine in the controller to decode the encoded data to obtain the second set of error correction configuring parameters, wherein the LDPC engine stores a first set of error correction configuring parameters, and during decoding the encoded data, the LDPC engine performs decoding corresponding to a first LDPC characteristic matrix based on the first set of error correction configuring parameters; and storing the second set of error correction configuring parameters obtained by decoding the encoded data into a random access memory (RAM) in the LDPC engine, and controlling the LDPC engine to perform operations corresponding to a second LDPC characteristic matrix based on the second set of error correction configuring parameters in the RAM, in order to make the LDPC engine be equipped with encoding and decoding capabilities corresponding to the second LDPC characteristic matrix, for allowing the controller to access data in the at least one non-volatile memory element. The first LDPC characteristic matrix includes a plurality of sub-matrices, and each of the plurality of sub-matrices of the first LDPC characteristic matrix is a square matrix selected from a predetermined set. The second LDPC characteristic matrix includes a plurality of sub-matrices, and each of the plurality of sub-matrices of the second LDPC characteristic matrix is a square matrix selected from the predetermined set; a size of any sub-matrix within the plurality of sub-matrices of the second LDPC characteristic matrix is equal to a size of any sub-matrix within the plurality of sub-matrices of the first LDPC characteristic matrix. The predetermined set includes a zero matrix, an identity matrix, and at least one cyclic-shifted matrix of the identity matrix, wherein any cyclic-shifted matrix within the at least one cyclic-shifted matrix is obtained by cyclically shifting all column vectors in the identity matrix, or by cyclically shifting all row vectors in the identity matrix.

Besides the above method, the present invention also correspondingly provides a memory apparatus. The memory apparatus includes at least one non-volatile (NV) memory element and a controller. Each of the at least one NV memory element includes a plurality of blocks. The controller is arranged to control the at least one non-volatile memory element and includes a processing unit, so as to manage the memory apparatus according to a program code embedded in the processing unit or received from outside of the processing unit, wherein the controller reads encoded data of a second set of error correction configuring parameters from a system block of a specific non-volatile memory element within the at least one non-volatile memory element, and utilize a low-density parity-check engine in the controller to decode the encoded data to obtain the second set of error correction configuring parameters, wherein the LDPC engine stores a first set of error correction configuring parameters, and during decoding the encoded data, the LDPC engine performs decoding corresponding to a first LDPC characteristic matrix based on the first set of error correction configuring parameters, wherein the controller stores the second set of error correction configuring parameters obtained by decoding the encoded data into a random access memory (RAM) in the LDPC engine, and controls the LDPC engine to perform operations corresponding to a second LDPC characteristic matrix based on the second set of error correction configuring parameters in the RAM, in order to make the LDPC engine be equipped with encoding and decoding capabilities corresponding to the second LDPC characteristic matrix, for allowing the controller to access data in the at least one non-volatile memory element. The first LDPC characteristic matrix includes a plurality of sub-matrices, and each of the plurality of sub-matrices of the first LDPC characteristic matrix is a square matrix selected from a predetermined set. The second LDPC characteristic matrix includes a plurality of sub-matrices, and each of the plurality of sub-matrices of the second LDPC characteristic matrix is a square matrix selected from the predetermined set. A size of any sub-matrix within the plurality of sub-matrices of the second LDPC characteristic matrix is equal to a size of any sub-matrix within the plurality of sub-matrices of the first LDPC characteristic matrix. The predetermined set includes a zero matrix, an identity matrix, and at least one cyclic-shifted matrix of the identity matrix, wherein any cyclic-shifted matrix within the at least one cyclic-shifted matrix is obtained by cyclically shifting all column vectors in the identity matrix, or by cyclically shifting all row vectors in the identity matrix.

Besides the above method, the present invention also correspondingly provides a controller of a memory apparatus. The memory apparatus includes at least one non-volatile (NV) memory element. Each of the at least one NV memory element includes a plurality of blocks. The controller includes a low-density parity-check (LDPC) engine and a processing unit. The LDPC engine is arranged to perform error correction for the controller, wherein the LDPC engine comprises a hardware circuit. The processing unit is coupled to the LDPC engine, and arranged to manage the memory apparatus according to a program code embedded in the processing unit or received from outside of the processing unit. The controller reads encoded data of a second set of error correction configuring parameters from a system block of a specific non-volatile memory element within the at least one non-volatile memory element, and utilizes the LDPC engine in the controller to decode the encoded data to obtain the second set of error correction configuring parameters, wherein the LDPC engine stores a first set of error correction configuring parameters, and during decoding the encoded data, the LDPC engine performs decoding corresponding to a first LDPC characteristic matrix based on the first set of error correction configuring parameters, wherein the controller stores the second set of error correction configuring parameters obtained by decoding the encoded data into a random access memory (RAM) in the LDPC engine, and controls the LDPC engine to perform operations corresponding to a second LDPC characteristic matrix based on the second set of error correction configuring parameters in the RAM, in order to make the LDPC engine be equipped with encoding and decoding capabilities corresponding to the second LDPC characteristic matrix, for allowing the controller to access data in the at least one non-volatile memory element. The first LDPC characteristic matrix includes a plurality of sub-matrices, and each of the plurality of sub-matrices of the first LDPC characteristic matrix is a square matrix selected from a predetermined set. The second LDPC characteristic matrix comprises a plurality of sub-matrices, and each of the plurality of sub-matrices of the second LDPC characteristic matrix is a square matrix selected from the predetermined set. A size of any sub-matrix within the plurality of sub-matrices of the second LDPC characteristic matrix is equal to a size of any sub-matrix within the plurality of sub-matrices of the first LDPC characteristic matrix. The predetermined set includes a zero matrix, an identity matrix, and at least one cyclic-shifted matrix of the identity matrix, wherein any cyclic-shifted matrix within the at least one cyclic-shifted matrix is obtained by cyclically shifting all column vectors in the identity matrix, or by cyclically shifting all row vectors in the identity matrix.

Besides the above method, the present invention also correspondingly provides a method for controlling a memory apparatus. The memory apparatus includes at least one non-volatile (NV) memory element. Each of the at least one NV memory element includes a plurality of blocks. The method is applied to an initialization apparatus, so as to utilize a controller in the memory apparatus to perform initialization to the memory apparatus. The controller is used to control the at least one non-volatile memory element, the method including following steps: writing encoded data of a second set of error correction configuring parameters into a system block of a specific non-volatile memory element within the at least one non-volatile memory element, wherein the encoded data is generated in advance by performing encoding to the second set of error correction configuring parameters based on the first set of error correction configuring parameters; utilizing the controller to read the encoded data of the second set of error correction configuring parameters from the system block of the specific non-volatile memory element, and utilizing a low-density parity-check (LDPC) engine in the controller to decode the encoded data to obtain the second set of error correction configuring parameters, wherein the LDPC engine stores the first set of error correction configuring parameters, and during decoding the encoded data, the LDPC engine performs decoding corresponding to a first LDPC characteristic matrix based on the first set of error correction configuring parameters; and utilizing the controller to store the second set of error correction configuring parameters obtained by decoding the encoded data into a random access memory (RAM) in the LDPC engine, and controlling the LDPC engine to perform operations corresponding to a second LDPC characteristic matrix based on the second set of error correction configuring parameters in the RAM, in order to make the LDPC engine be equipped with encoding and decoding capabilities corresponding to the second LDPC characteristic matrix, for allowing the controller to access data in the at least one non-volatile memory element during the initialization. The first LDPC characteristic matrix includes a plurality of sub-matrices, and each sub-matrix within the plurality of sub-matrices of the first LDPC characteristic matrix is a square matrix selected from a predetermined set. The second LDPC characteristic matrix includes a plurality of sub-matrices, and each sub-matrix within the plurality of sub-matrices of the second LDPC characteristic matrix is a square matrix selected from a predetermined set. A size of any sub-matrix within the plurality of sub-matrices of the second LDPC characteristic matrix is equal to a size of any sub-matrix within the plurality of sub-matrices of the first LDPC characteristic matrix. The predetermined set includes a zero matrix, an identity matrix, and at least one cyclic-shifted matrix of the identity matrix, wherein any cyclic-shifted matrix within the at least one cyclic-shifted matrix is obtained by cyclically shifting all column vectors in the identity matrix, or by cyclically shifting all row vectors in the identity matrix.

Compared with related arts, one of advantages provided by the method, the memory apparatus and the controller of the present invention is that, the same controller chip can be applied in different products. Hence, the present invention is capable of saving the cost (e.g., the time cost and the material cost) of designing a plurality of versions of controller chips.

Compared with related arts, another advantage provided by the present invention is that, the method, the memory apparatus and the controller of the present invention are capable of raising the operating efficiency of the memory apparatus without changing the controller chip. Hence, the present invention does provide a better basic architecture compared with related arts.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
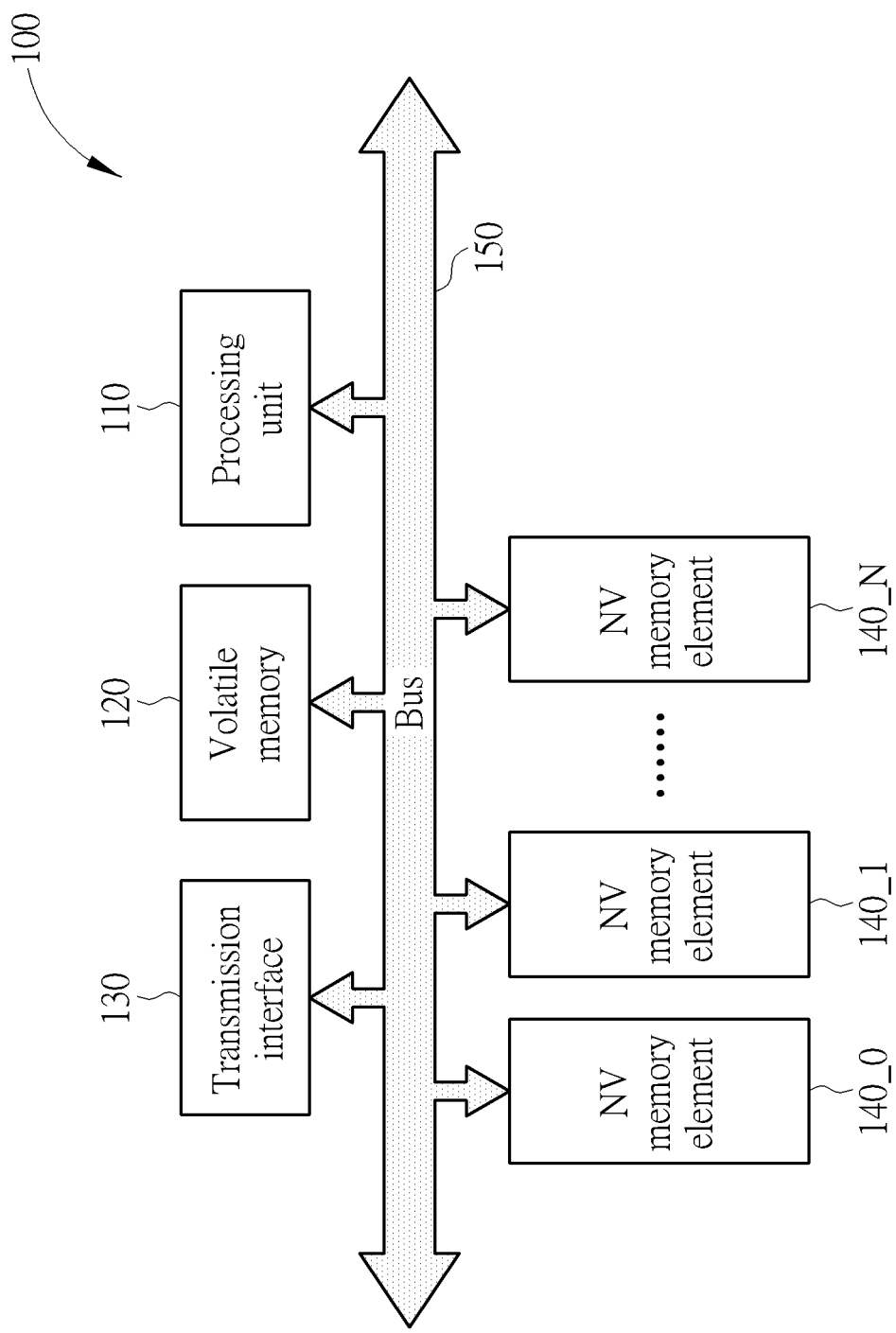
FIG. 1 is a diagram illustrating a memory apparatus according to a first embodiment of the present invention.

Please refer to FIG. 1, which is a diagram illustrating a memory apparatus 100 according to a first embodiment of the present invention. The memory apparatus 100 includes a processing unit 110, a volatile memory 120, a transmission interface 130, a plurality of non-volatile (NV) memory elements 140_0, 140_1, . . . , 140_N (the index "N" represents a positive integer) such as (N+1) flash chips, and a bus 150. Typically, after the transmission interface 130 is coupled to a host device (not shown in FIG. 1), the host device may access the memory apparatus 100 through the transmission interface 130. For example, the host device may be a personal computer (PC), such as a laptop computer or a desktop computer.

The processing unit 110 may manage the memory apparatus 100 according to a program code (not shown) embedded in the processing unit 110 or received from outside the processing unit 110. For example, the program code may be a hardware code embedded in the processing unit 110, especially a read-only ROM code. For another example, the program code may be a firmware code received from outside the processing unit 110. More particularly, the processing unit 110 is used for controlling the volatile memory 120, the transmission interface 130, the non-volatile memory elements 140_0-140_N, and the bus 150. The processing unit 110 in this embodiment may be an advanced reduced instruction set computer machine (advanced RISC machine, ARM) processor or an Argonaut RISC core (ARC) processor. This is merely for illustrative purposes, and not meant to be limitations to the present invention. According to a modification of this embodiment, the processing unit 110 may be another type of processor. According to another modification of this embodiment, the processing unit 110 may receive some commands from an external electronic apparatus (e.g., a PC) other than the memory apparatus 100, and perform an initialization (activation) operation upon the memory apparatus 100 according to the commands, wherein the aforementioned initialization operation is usually performed when the memory apparatus 100 is just manufactured, and the external electronic apparatus may be viewed as an initialization apparatus. In this situation, the program of the corresponding initialization procedure executed in the external electronic apparatus may be viewed as an example of the aforementioned program code received from the processing unit 110.

Further, the volatile memory 120 may be used to store a global page address linking table, the data accessed by the host device, and the information required for accessing the memory apparatus 100. In this embodiment, the volatile memory 120 may be a dynamic random access memory (DRAM) or a static random access memory (SRAM). This is merely for illustrative purposes, and not meant to be limitations to the present invention. According to some modifications of this embodiment, the volatile memory 120 may be another type of volatile memory. For example, the volatile memory 120 may include an SRAM.

According to this embodiment, the transmission interface 130 shown in FIG. 1 is used to transmit data and commands between the host device and the memory apparatus 100, wherein the transmission interface 130 conforms to a specific communications specification, such as the serial advanced technology attachment (SATA) specification, the parallel advanced technology attachment (PATA) specification, or the universal serial bus (USB) specification. For example, the memory apparatus 100 may be a solid state drive (SSD) configured in the host device, and the specific communications specification may be a typical specification (e.g., SATA specification or PATA specification) arranged for implementing the internal communications of the host device. For another example, the memory apparatus 100 may be an SSD configured outside the host device, and the specific communications specification may be a typical communications specification (e.g., USB specification) arranged for implementing communications outside the host device. This is merely for illustrative purposes, and not meant to be limitations to the present invention. According to some modifications of this embodiment, the memory apparatus 100 may be a portable memory apparatus, such as a memory card, and the specific communications specification may be a typical communications specification arranged for implementing the input/output interface of a memory card, such as a secure digital (SD) standard or a compact flash (CF) standard.

Further, the non-volatile memory elements 140_0-140_N are used for storing data, wherein the non-volatile memory elements 140_0-140_N may be (but not limited to) NAND flash chips. The bus 150 is used to couple the processing unit 110, the volatile memory 120, the transmission interface 130, and the non-volatile memory elements 140_0-140_N, and perform the transmissions therebetween. In this embodiment, regarding the architecture shown in FIG. 1, all elements, except the non-volatile memory elements 140_0-140_N, may be integrated as a controller 100CON (not shown in FIG. 1), and more particularly, integrated as an integrated circuit (IC) such as a controller chip, wherein the controller 100CON is used to control at least one non-volatile memory element in the memory apparatus 100 (e.g., the non-volatile memory elements 140_0-140_N), and can be viewed as a controller of the memory apparatus 100.

In this embodiment, each of the non-volatile memory elements 140_0-140_N shown in FIG. 1 (e.g., the non-volatile memory element 140_n) may include a plurality of blocks, wherein the non-volatile memory element 140_n may be a flash chip in this embodiment, and the index n may be any integer within the range [0, N]. Specifically, each block may include a plurality of pages, and each page may include a plurality of sections. For example, one section can be used as the minimum read unit. That is, during a reading operation, the processing unit 110 may read one section or a plurality of sections. However, this is merely for illustrative purposes, and not meant to be limitations to the present invention.

Figure 2:
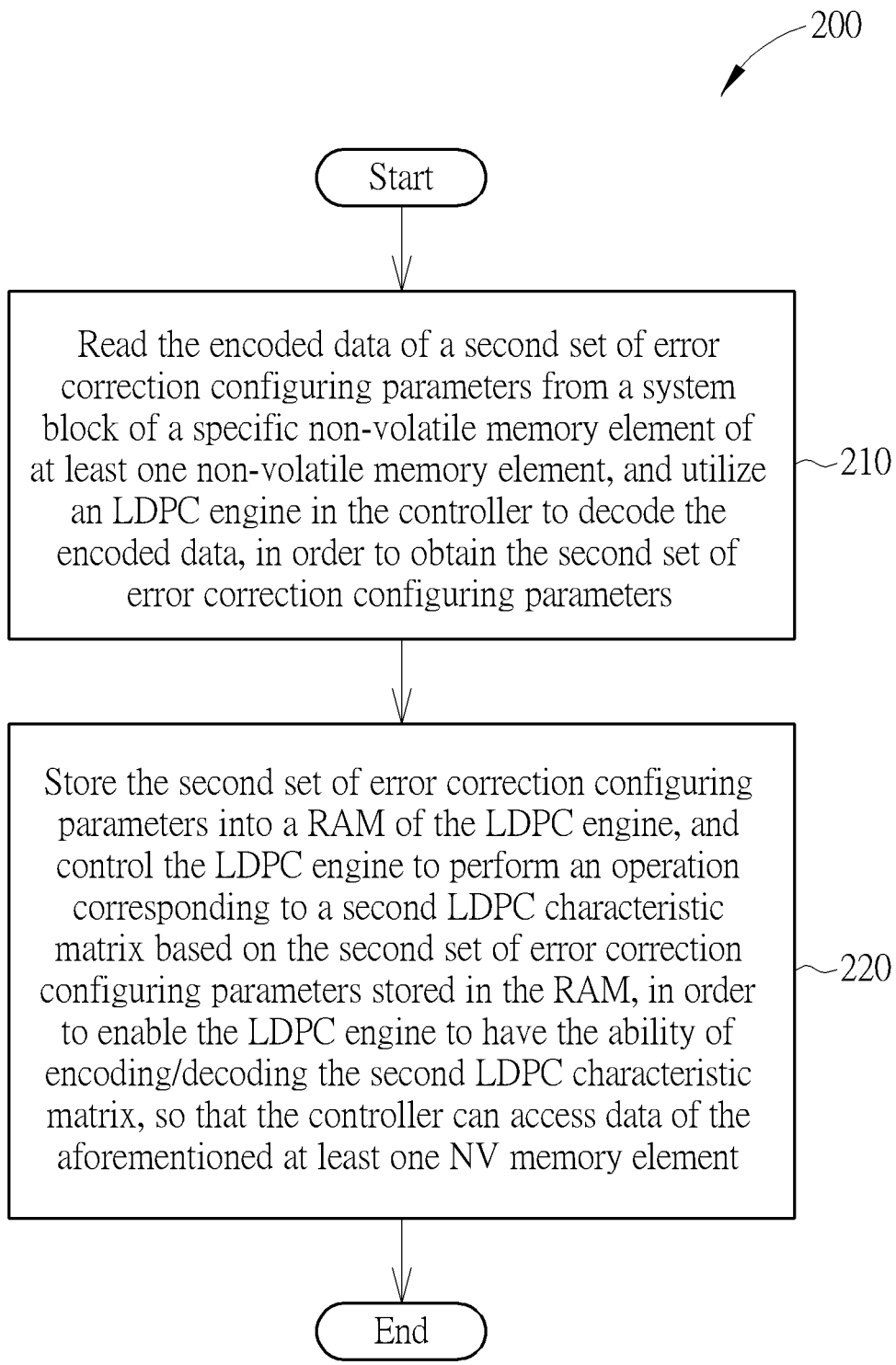
FIG. 2 is a flowchart illustrating a method for controlling a memory apparatus according to an embodiment of the present invention.

FIG. 2 is a flowchart illustrating a method 200 for controlling a memory apparatus according to an embodiment of the present invention. The method 200 may be applied to the memory apparatus 100 shown in FIG. 1, and more particularly, to the aforementioned controller 100CON (e.g., the memory controller executing the program code through the processing unit 110), wherein the controller 100CON that executes the program code is used to control the aforementioned at least one non-volatile memory element, such as the non-volatile memory elements 140_0-140_N shown in FIG. 1. For example, when the memory apparatus 100 is powered on, the controller 100CON may execute the workflow shown in FIG. 2. This is merely for illustrative purposes, and not meant to be limitations to the present invention. The method 200 is detailed as follows.

In step 210, the controller 100CON reads the encoded data of a second set of error correction configuring parameters from a system block 140SB of a specific non-volatile memory element (e.g., the non-volatile memory element 140_n, especially the non-volatile memory element 140_0) of the aforementioned at least one non-volatile memory element, and utilizes a low-density parity-check (LDPC) engine 180 (not shown in FIG. 2) in the controller 100CON to decode the encoded data, in order to obtain the second set of error correction configuring parameters, wherein the LDPC engine 180 stores a first set of error correction configuring parameters, and during decoding the encoded data, the LDPC engine 180 performs decoding corresponding to a first LDPC characteristic matrix based on the first set of error correction configuring parameters.

In step 220, the controller 100CON stores the second set of error correction configuring parameters (which are obtained by decoding the encoded data) into a random access memory (RAM) (not shown in the figure) of the LDPC engine 180, and controls the LDPC engine 180 to perform an operation corresponding to a second LDPC characteristic matrix based on the second set of error correction configuring parameters stored in the RAM. This enables the LDPC engine 180 to have the ability of encoding/decoding the second LDPC characteristic matrix, so that the controller 100CON can access data of the aforementioned at least one non-volatile memory element.

For example, when the memory apparatus 100 is powered on, the controller 100CON reads the encoded data form the system block, and utilizes the LDPC engine 180 to decode the encoded data to obtain the second set of error correction configuring parameters, thereby allowing the LDPC engine 180 to perform an operation corresponding to the second LDPC characteristic matrix based on the second set of error correction configuring parameters in the RAM. When the memory apparatus 100 is powered off, the second set of error correction configuring parameters in the RAM is lost, thus making the LDPC engine 180 temporarily lose the encoding/decoding ability corresponding to the second LDPC characteristic matrix until the memory apparatus 100 is powered on again. More particularly, the workflow shown in FIG. 2 can be performed again when the memory apparatus 100 is powered on again.

In practice, the encoded data mentioned in step 210 may be generated in advance by encoding the second set of error correction configuring parameters based on the first set of error correction configuring parameters, and the encoded data is written into the system block in advance. This is merely for illustrative purposes, and not meant to be limitations to the present invention. Please note that in this embodiment, by means of utilizing different sets of the error correction configuring parameters, the LDPC engine 180 may be arranged to have different strengths of error correction ability, respectively. Hence, the error correction ability of the LDPC engine 180 may be changed by reconfiguration, wherein the LDPC engine 180 may be regarded as a configurable LDPC engine. For example, in the situation that the LDPC engine 180 is operated based on the first set of error correction configuring parameters, the error correction ability of the LDPC engine 180 corresponds to the first LDPC characteristic matrix. For another example, in the situation that the LDPC engine 180 is operated based on the second set of error correction configuring parameters, the error correction ability of the LDPC engine 180 corresponds to the second LDPC characteristic matrix.

According to this embodiment, the first LDPC characteristic matrix includes a plurality of sub-matrices, and each of the plurality of sub-matrices of the first LDPC characteristic matrix is a square matrix selected from a predetermined set. Further, the second LDPC characteristic matrix includes a plurality of sub-matrices, and each of the plurality of sub-matrices of the second LDPC characteristic matrix is a square matrix selected from the predetermined set. Moreover, the size of any of the plurality of sub-matrices of the second LDPC characteristic matrix is equal to the size of any of the plurality of sub-matrices of the first LDPC characteristic matrix. In this embodiment, the predetermined set includes a zero matrix, an identity matrix and at least one cyclic-shifted matrix (e.g., a cyclic-shifted matrix or a plurality of cyclic-shifted matrices) of the identity matrix, wherein in the aforementioned at least one cyclic-shifted matrix, any cyclic-shifted matrix is obtained by cyclically shifting all the column vectors in the identity matrix, or by cyclically shifting all the row vectors in the identity matrix. For example, the zero matrix, the identity matrix and the aforementioned at least one cyclic-shifted matrix are square matrices with the size of ($Z*Z$), wherein the size parameter of the square matrices $Z$ may be a positive integer larger than 1.

More particularly, the number of the sub-matrices in the second LDPC characteristic matrix which are arranged along the column direction is smaller than the number of the sub-matrices in the first LDPC characteristic matrix which are arranged along the column direction. Further, the number of the sub-matrices in the second LDPC characteristic matrix which are arranged along the row direction is smaller than the number of the sub-matrices in the first LDPC characteristic matrix which are arranged along the row direction. For example, the number of the sub-matrices in the second LDPC characteristic matrix which are arranged along the column direction may be equal to the number of the sub-matrices in the first LDPC characteristic matrix which are arranged along the column direction minus 1. Further, the number of the sub-matrices in the second LDPC characteristic matrix which are arranged along the row direction may be equal to the number of the sub-matrices in the first LDPC characteristic matrix which are arranged along the row direction minus 1.

Further, the first set of error correction configuring parameters includes the total number of columns and the total number of rows of the first LDPC characteristic matrix, and the second set of error correction configuring parameters includes the total number of columns and the total number of rows of the second LDPC characteristic matrix. Please note that, considering the design of the encoding/decoding algorithms of the LDPC engine 180, the contents of the sets of error correction configuring parameter may change. For example, in the situation that the iterative encoding/decoding of the LDPC engine 180 is based on either of the row direction of the first LDPC characteristic matrix and the row direction of the second LDPC characteristic matrix, the first set of error correction configuring parameters includes the number of non-zero sub-matrices within each row of sub-matrices in the first LDPC characteristic matrix, and the second set of error correction configuring parameters includes the number of non-zero sub-matrices within each row of sub-matrices in the second LDPC characteristic matrix. For another example, in the situation that the iterative encoding/decoding of the LDPC engine 180 is based on either of the column direction of the first LDPC characteristic matrix and the column direction of the second LDPC characteristic matrix, the first set of error correction configuring parameters includes the number of non-zero sub-matrices within each column of sub-matrices in the first LDPC characteristic matrix, and the second set of error correction configuring parameters includes the number of non-zero sub-matrices within each column of sub-matrices in the second LDPC characteristic matrix.

Regarding the details of the implementations of the first LDPC characteristic matrix, the second LDPC characteristic matrix, and the corresponding first set of error correction configuring parameters and second set of error correction configuring parameters, please refer to the descriptions of the following embodiments.

Figure 3:
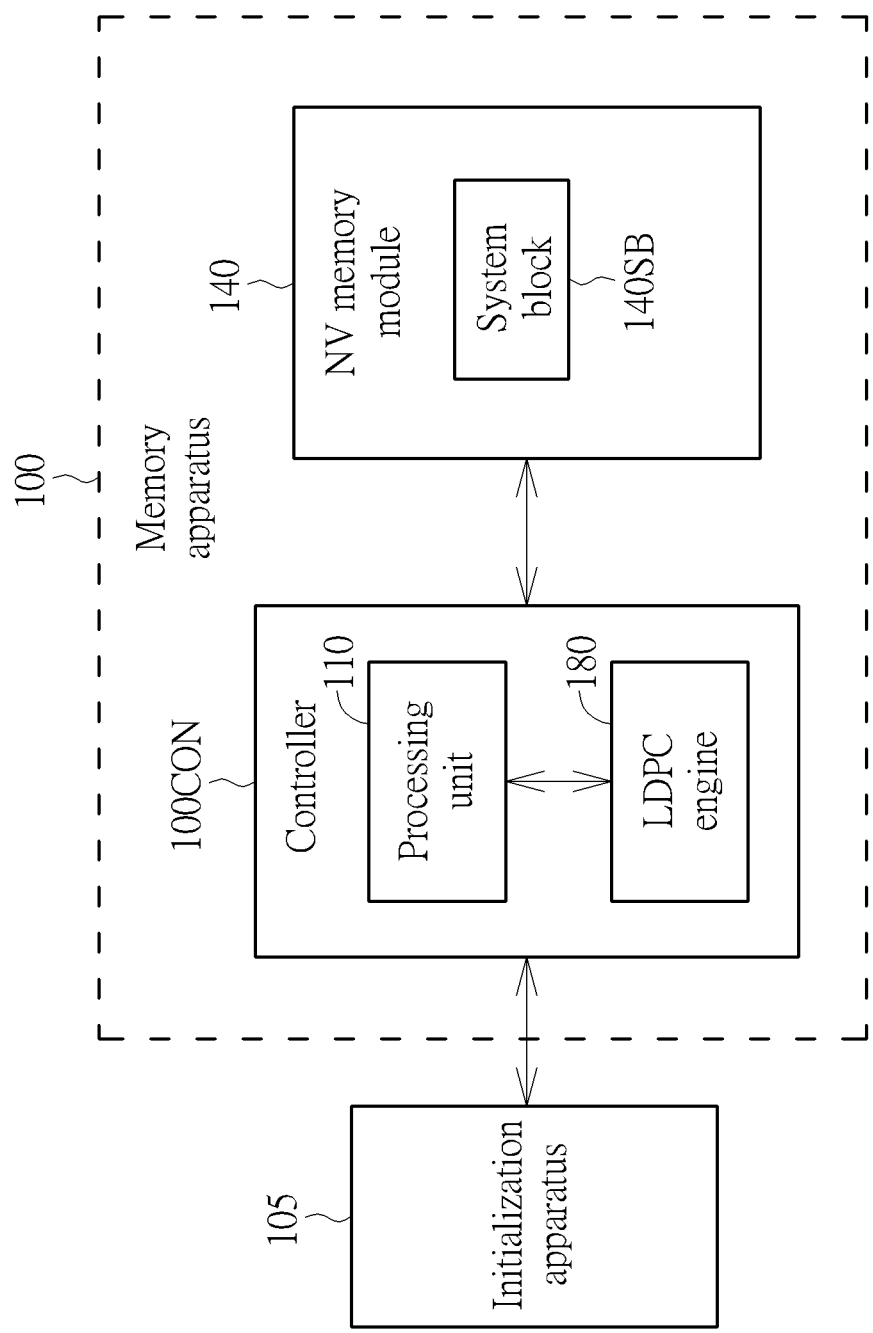
FIG. 3 is a diagram illustrating a control scheme involved by the method shown in FIG. 2 according to an embodiment.

FIG. 3 is a diagram illustrating a control scheme involved by the method 200 shown in FIG. 2 according to an embodiment. The non-volatile memory module 140 shown in FIG. 3 includes the non-volatile memory elements 140_0, 140_1, . . . , and 140_N shown in FIG. 1, wherein the system block 140SB may be an example of the aforementioned system block, and the initialization apparatus 105 may be an example of the aforementioned initialization apparatus.

According to this embodiment, during initializing the memory apparatus 100, the initialization apparatus 105 may write the encoded data mentioned in step 210 into the system block 140SB through the controller 100CON. After all the initialization operations are completed, the operator may disconnect the memory apparatus 100 from the initialization apparatus 105. Hence, when the user of the memory apparatus 100 starts to use the memory apparatus 100 and the memory apparatus 100 is powered on, the controller 100CON may perform the workflow shown in FIG. 2. The features of this embodiment that are identical to those of the previous embodiments/modifications are omitted here for brevity.

Figure 4:
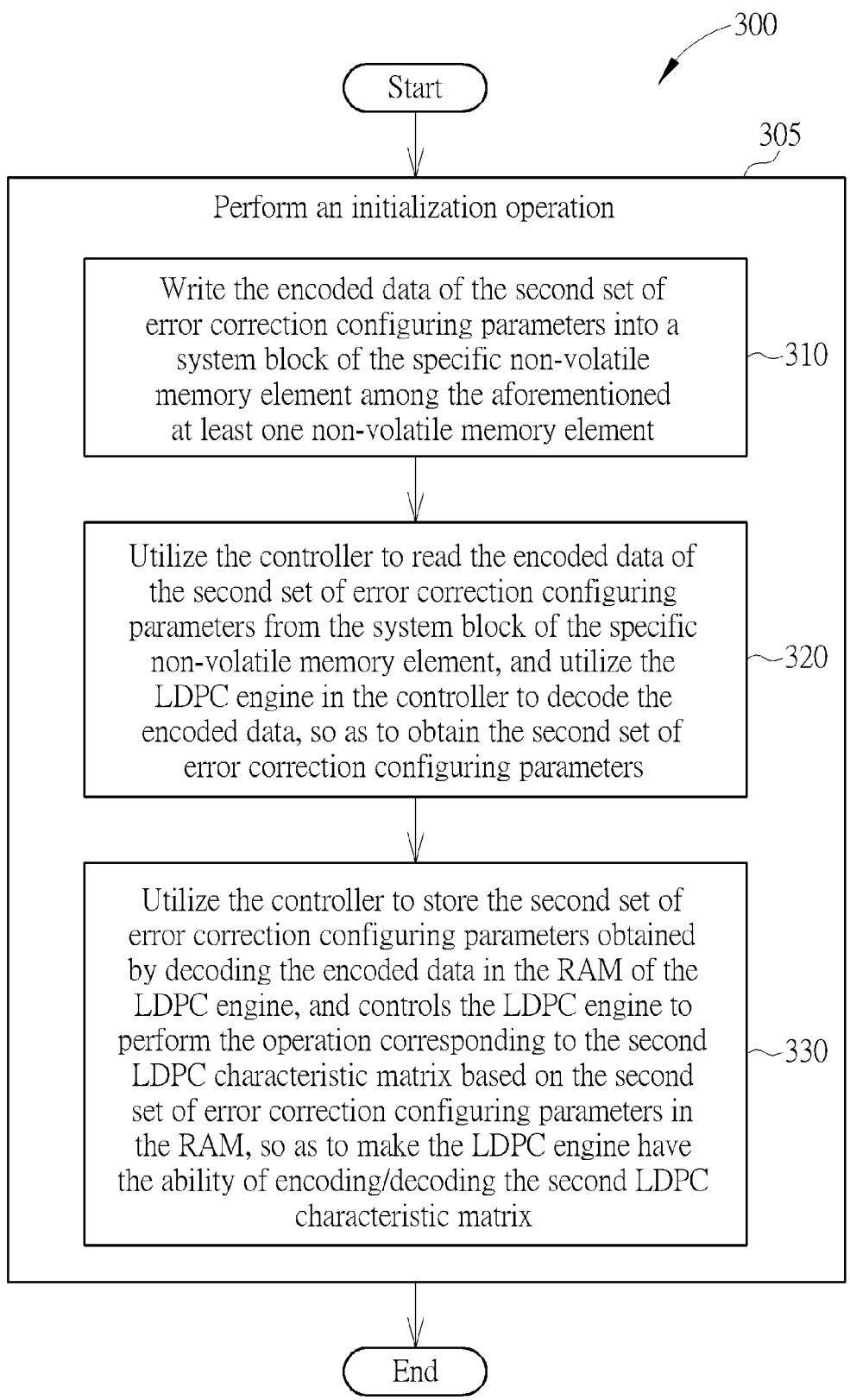
FIG. 4 is a flowchart illustrating a method for controlling a memory apparatus according to another embodiment of the present invention.

FIG. 4 is a flowchart illustrating a method 300 for controlling a memory apparatus according to another embodiment of the present invention. The method 300 may be applied to at least a portion (e.g., part or all) of the architecture shown in FIG. 3, especially the initialization apparatus 105 and the aforementioned controller 100CON (e.g., the memory controller executing the aforementioned program code through the processing unit 110).

In step 305, the initialization apparatus 105 performs the initialization operation upon the memory apparatus 100. According to this embodiment, the program corresponding to the initialization procedure in the initialization apparatus 105 may be modified according to the specification of the controller and some requirements.

In step 310, the initialization apparatus 105 writes the encoded data of the second set of error correction configuring parameters into the system block 140SB of the specific non-volatile memory element within the aforementioned at least one non-volatile memory element, wherein the encoded data is generated in advance by encoding the second set of error correction configuring parameters based on the first set of error correction configuring parameters. With the protection provided by encoding, the correctness of the second set of error correction configuring parameters can be ensured. Hence, after the LDPC engine 180 is reconfigured, the error correction ability of the LDPC engine 180 may also be ensured.

In step 320, the initialization apparatus 105 utilizes the controller 100CON to read the encoded data of the second set of error correction configuring parameters from the system block 140SB of the specific non-volatile memory element, and utilizes the LDPC engine 180 in the controller 100CON to decode the encoded data, so as to obtain the second set of error correction configuring parameters, wherein the LDPC engine 180 stores the first set of error correction configuring parameters, and during decoding the encoded data, the LDPC engine 180 decodes the first LDPC characteristic matrix based on the first set of error correction configuring parameters. For example, the LDPC engine 180 may include a RAM, arranged for storing the first set of error correction configuring parameters. This is merely for illustrative purposes, and not meant to be limitations to the present invention. In other examples, the LDPC engine 180 may include other types of storage units, in order to store the first set of error correction configuring parameters.

In step 330, the initialization apparatus 105 utilizes the controller 100CON to store the second set of error correction configuring parameters obtained by decoding the encoded data in the RAM of the LDPC engine 180, and controls the LDPC engine 180 to perform the operation corresponding to the second LDPC characteristic matrix based on the second set of error correction configuring parameters in the RAM, so as to make the LDPC engine 180 have the ability of encoding/decoding the second LDPC characteristic matrix. In this way, the controller 100CON may access data at the aforementioned at least one non-volatile memory element during the initialization.

Please note that, the workflow shown in FIG. 4 focuses on the initialization procedure and the operations related to the method of the present invention, such as the operations shown in step 310, step 320, and step 330, wherein other operations in the initialization procedure may be implemented according to common techniques in the related arts. The features of this embodiment that re identical to those of the embodiments/modifications mentioned above are omitted here for brevity.

Figure 5:
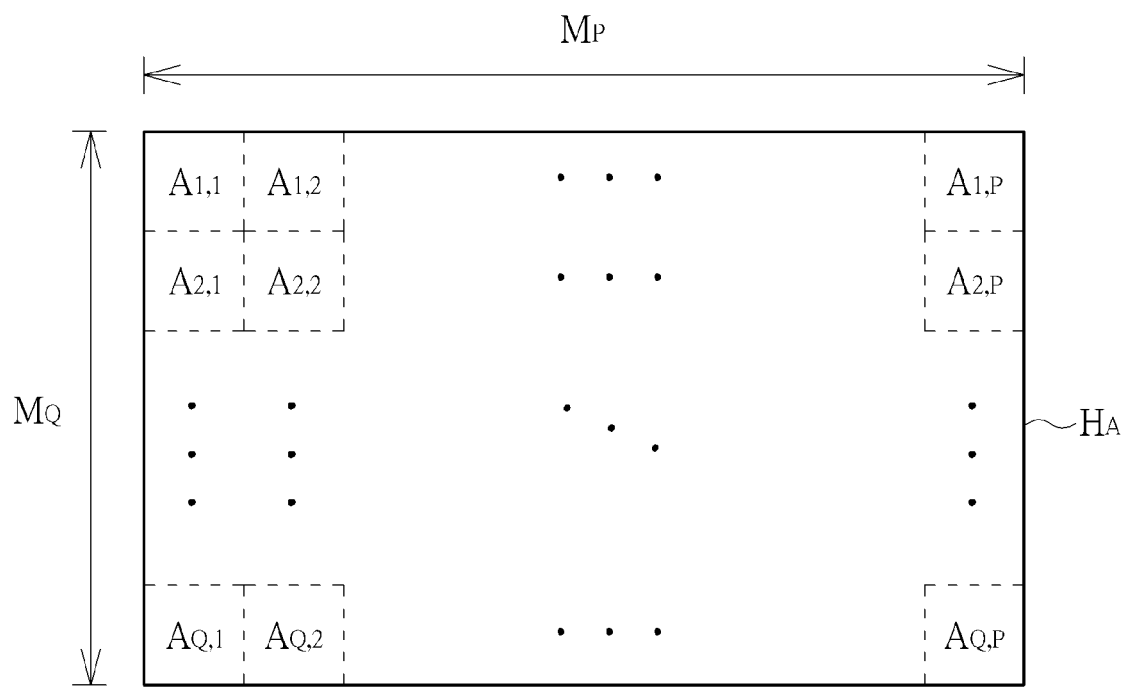
FIG. 5 is a diagram illustrating a first LDPC characteristic matrix involved by the method shown in FIG. 2 according to an embodiment.

FIG. 5 is a diagram illustrating a first LDPC characteristic matrix $H_A$ involved by the method 200 shown in FIG. 2 according to an embodiment, wherein the first LDPC characteristic matrix $H_A$ can be an example of the first LDPC characteristic matrix mentioned above. As shown in FIG. 5, the first LDPC characteristic matrix $H_A$ includes the sub-matrices $\{\{A_{1,1}, A_{1,2}, \ldots, A_{1,P}\}, \{A_{2,1}, A_{2,2}, \ldots, A_{2,P}\}, \ldots, \{A_{Q,1}, A_{Q,2}, \ldots, A_{Q,P}\}\}$, and the element numbers in each row and each column are $M_P$ and $M_Q$, respectively, wherein $M_P=(Z*P)$ and $M_Q=(Z*Q)$. Further, in the first LDPC characteristic matrix $H_A$, the element numbers $M_P$ and $M_Q$ can be the aforementioned total column number and total row number, respectively. Further, the parameter P represents the sub-matrix number of each row of sub-matrices in the aforementioned first LDPC characteristic matrix $H_A$, and the parameter Q represents the sub-matrix number of each column of sub-matrices in the aforementioned first LDPC characteristic matrix $H_A$. The features of this embodiment that are identical to those of the previous embodiments/modifications are omitted here for brevity.

Figure 6:
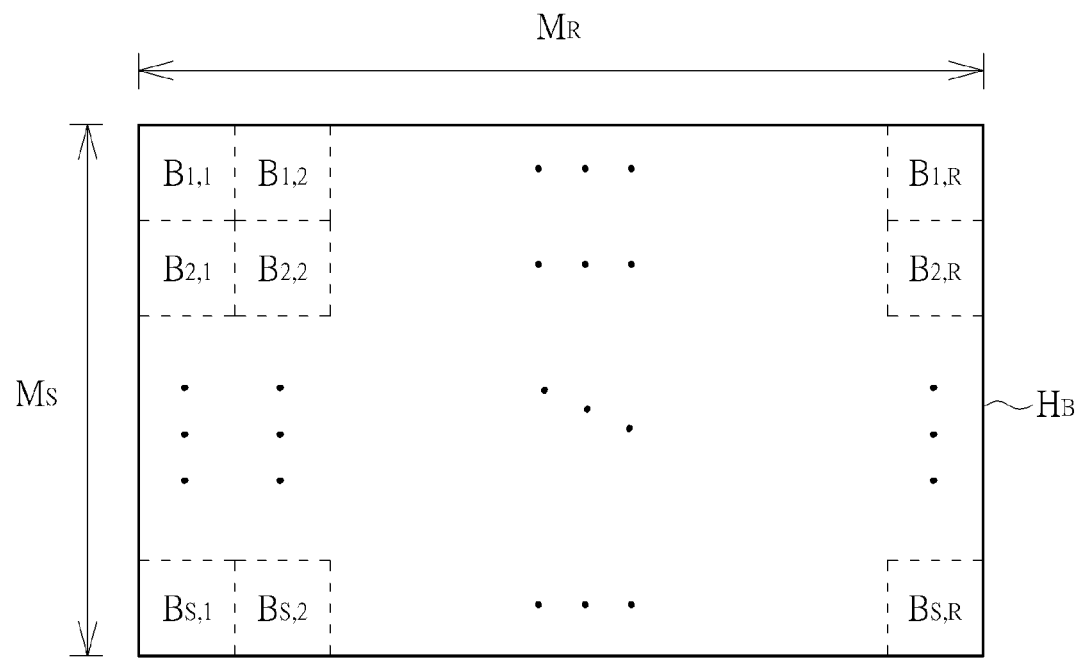
FIG. 6 is a diagram illustrating a second LDPC characteristic matrix involved by the method shown in FIG. 2 according to an embodiment.

FIG. 6 is a diagram illustrating the second LDPC characteristic matrix $H_B$ involved by the method 200 shown in FIG. 2 according to an embodiment, wherein the second LDPC characteristic matrix $H_B$ can be an example of the aforementioned second LDPC characteristic matrix $H_B$. As shown in FIG. 6, the second LDPC characteristic matrix $H_B$ includes the sub-matrices $\{\{B_{1,1}, B_{1,2}, \ldots, B_{1,R}\}, \{B_{2,1}, B_{2,2}, \ldots, B_{2,R}\}, \ldots, \{B_{S,1}, B_{S,2}, \ldots, B_{S,R}\}\}$, and the element numbers of each row and each column are $M_R$ and $M_S$, respectively, wherein $MR=(Z*R)$ and $MS=(Z*S)$. Further, in the second LDPC characteristic matrix $H_B$, the element numbers $M_R$ and $M_S$ can be the aforementioned total column number and total row number, respectively. Further, the parameter R represents the sub-matrix number of each row of sub-matrices in the aforementioned second LDPC characteristic matrix $H_B$, and the parameter S represents the sub-matrix number of each column of sub-matrices in the aforementioned second LDPC characteristic matrix $H_B$. The features of this embodiment that are identical to those of the previous embodiments/modifications are omitted here for brevity.

Figure 7:
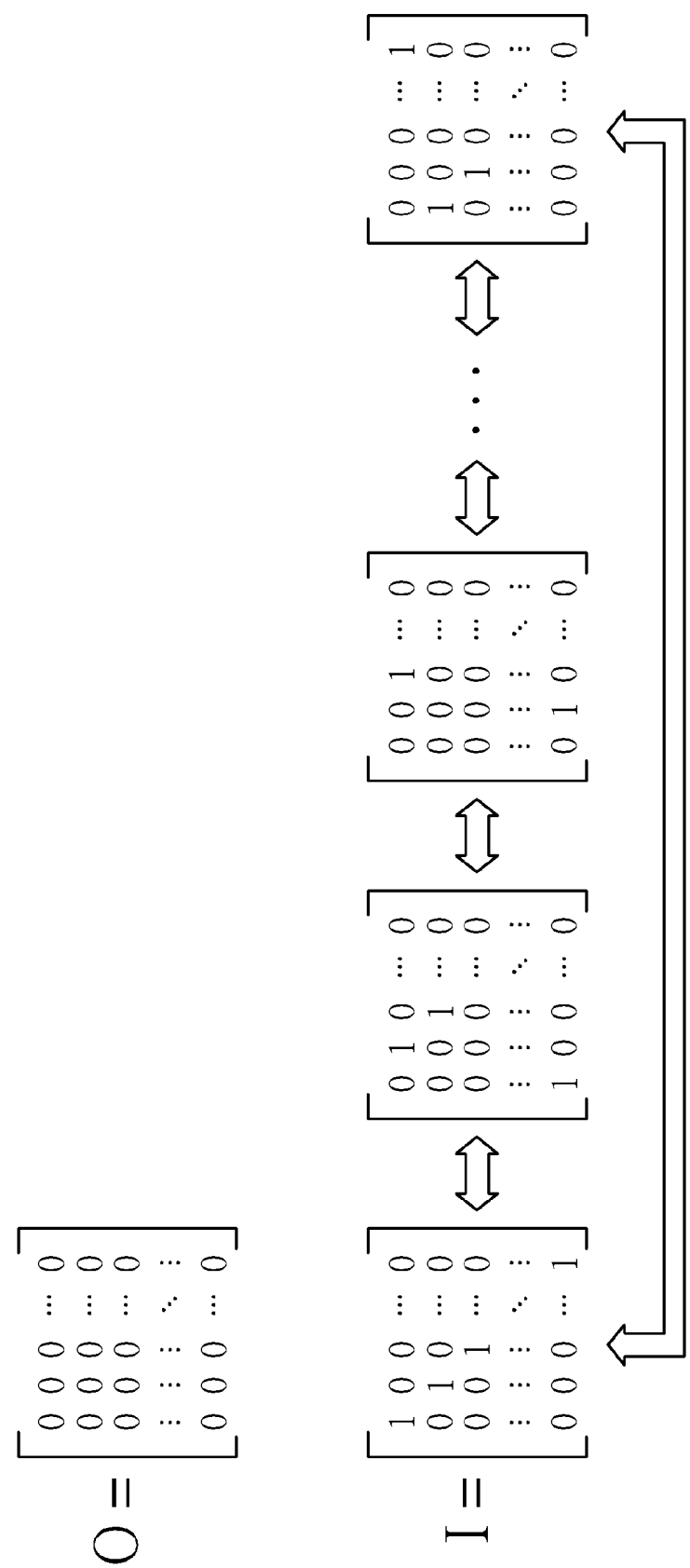
FIG. 7 is a diagram illustrating a predetermined set involved by the method shown in FIG. 2 according to an embodiment.

FIG. 7 is a diagram illustrating a predetermined set involved by the method 200 shown in FIG. 2 according to an embodiment, wherein the zero matrix O can be an example of the aforementioned zero matrix, and the identity matrix I can be an example of the aforementioned identity matrix, and the cyclic-shifted matrices depicted at the right side of the identity matrix I may be an example of the aforementioned at least one cyclic-shifted matrix. For example, the aforementioned at least one cyclic-shifted matrix, such as the cyclic-shifted matrices depicted in FIG. 7, may be obtained by cyclically rightward shifting all column vectors of the identity matrix I or by cyclically upward shifting all row vectors of the identity matrix I. This is merely for illustrative purposes, and not meant to be limitations to the present invention. For another example, the aforementioned at least one cyclic-shifted matrix, such as the cyclic-shifted matrices depicted in FIG. 7, may be obtained by cyclically leftward shifting all column vectors of the identity matrix I or by cyclically downward shifting all row vectors of the identity matrix I. The features of this embodiment that are identical to those of the previous embodiments/modifications are omitted here for brevity.

Based on the above embodiments, the manufacturer of the controller 100CON may determine the contents of the first LDPC characteristic matrix and the second LDPC characteristic according to the strengths of error correction ability. Typically, the first set of error correction configuring parameters and the second set of error correction configuring parameters correspond to different LDPC characteristic matrices (or different LDPC codes). When the size (Z*Z) of each selectable square matrix in the predetermined set is selected, all of the selectable square matrices in the predetermined set may be determined. Since each sub-matrix in the first LDPC characteristic matrix and each sub-matrix in the second LDPC characteristic matrix are selected from the predetermined set, the LDPC engine 180 may be designed to automatically refer to the first set of error correction configuring parameters and the second set of error correction configuring parameters to generate the first LDPC characteristic matrix and the second LDPC characteristic matrix. Hence, in the situation that the size parameter Z of the square matrix has been selected, by means of utilizing different sets of error correction configuring parameters, the LDPC engine 180 may be configured to have different strengths of error correction ability. More particularly, in the situation that the limitations related to the first LDPC characteristic matrix, the second LDPC characteristic matrix, the corresponding first set of error correction configuring parameters and the second set of error correction configuring parameters are exerted on the control scheme shown in FIG. 3, the goal of applying the same controller chip to different products may be achieved easily, and the goal of raising the performance of the memory apparatus without changing the controller chip may also be achieved easily. Hence, compared with related arts, the present invention does provide a better basic architecture, and save the cost (e.g., time and material cost) required for designing a plurality of versions of controller chips.

Those skilled in the art will readily observe that numerous modifications and alterations of the apparatus and method may be made while retaining the teachings of the invention. Accordingly, the above disclosure should be construed as limited only by the metes and bounds of the appended claims.

What is claimed is:

1. A method for controlling a memory apparatus, the memory apparatus comprising at least one non-volatile (NV) memory element each comprising a plurality of blocks, the method applied to a controller in the memory apparatus, the controller arranged to control the at least one non-volatile memory element, the method comprising following steps:

reading encoded data of a second set of error correction configuring parameters from a system block of a specific non-volatile memory element within the at least one non-volatile memory element, and utilizing a low-density parity-check (LDPC) engine in the controller to decode the encoded data to obtain the second set of error correction configuring parameters, wherein the LDPC engine stores a first set of error correction configuring parameters, and during decoding the encoded data, the LDPC engine performs decoding corresponding to a first LDPC characteristic matrix based on the first set of error correction configuring parameters; and storing the second set of error correction configuring parameters obtained by decoding the encoded data into a random access memory (RAM) in the LDPC engine, and controlling the LDPC engine to perform operations corresponding to a second LDPC characteristic matrix based on the second set of error correction configuring parameters in the RAM, in order to make the LDPC engine be equipped with encoding and decoding capabilities corresponding to the second LDPC characteristic matrix, for allowing the controller to access data in the at least one non-volatile memory element;

wherein the first LDPC characteristic matrix comprises a plurality of sub-matrices, and each of the plurality of sub-matrices of the first LDPC characteristic matrix is a square matrix selected from a predetermined set;

the second LDPC characteristic matrix comprises a plurality of sub-matrices, and each of the plurality of sub-matrices of the second LDPC characteristic matrix is a square matrix selected from the predetermined set;

a size of any sub-matrix within the plurality of sub-matrices of the second LDPC characteristic matrix is equal to a size of any sub-matrix within the plurality of sub-matrices of the first LDPC characteristic matrix; and the predetermined set comprises a zero matrix, an identity matrix, and at least one cyclic-shifted matrix of the identity matrix, wherein any cyclic-shifted matrix within the at least one cyclic-shifted matrix is obtained by cyclically shifting all column vectors in the identity matrix, or by cyclically shifting all row vectors in the identity matrix.

2. The method of claim 1, wherein a number of sub-matrices of the second LDPC characteristic matrix arranged along a column direction is smaller than a number of sub-matrices of the first LDPC characteristic matrix arranged along the column direction; and a number of sub-matrices of the second LDPC characteristic matrix arranged along a row direction is smaller than a number of sub-matrices of the first LDPC characteristic matrix arranged along the row direction.

3. The method of claim 2, wherein the number of sub-matrices of the second LDPC characteristic matrix arranged along the column direction is equal to the number of sub-matrices of the first LDPC characteristic matrix arranged along the column direction minus 1; and the number of sub-matrices of the second LDPC characteristic matrix arranged along the row direction is equal to the number of sub-matrices of the first LDPC characteristic matrix arranged along the row direction minus 1.

4. The method of claim 1, wherein when the LDPC engine is operated based on the first set of error correction configuring parameters, an error correction ability of the LDPC engine corresponds to the first LDPC characteristic matrix; and when the LDPC engine is operated based on the second set of error correction configuring parameters, the error correction ability of the LDPC engine corresponds to the second LDPC characteristic matrix.

5. The method of claim 1, wherein the encoded data is generated in advance by performing encoding upon the second set of error correction configuring parameters based on the first set of error correction configuring parameters; and the encoded data is written into the system block in advance.

6. The method of claim 1, further comprising:
when the memory apparatus is powered on, reading the encoded data from the system block and utilizing the LDPC engine to decode the encoded data to obtain the second set of error correction configuring parameters, to allow the LDPC engine to perform operations corresponding to the second LDPC characteristic matrix based on the second set of error correction configuring parameters in the RAM.

7. The method of claim 6, wherein when the memory apparatus is powered off, the second set of error correction configuring parameters in the RAM is lost, causing the LDPC engine to temporarily lose encoding ability and decoding ability corresponding to the second LDPC characteristic matrix, until the memory apparatus is powered on again.

8. The method of claim 1, wherein the first set of error correction configuring parameters comprises a number of all columns of the first LDPC characteristic matrix and a number of all rows of the first LDPC characteristic matrix; and the second set of error correction configuring parameters comprises a number of all columns of the second LDPC characteristic matrix and a number of all rows of the second LDPC characteristic matrix.

9. The method of claim 1, wherein when iterative encoding and decoding of the LDPC engine are performed along either of a row direction of the first LDPC characteristic matrix and a row direction of the second LDPC characteristic, the first set of error correction configuring parameters comprises a number of non-zero sub-matrices in each row of the first LDPC characteristic matrix, and the second set of error correction configuring parameters comprises a number of non-zero sub-matrices in each row of the second LDPC characteristic matrix.

10. The method of claim 1, wherein when iterative encoding and decoding of the LDPC engine are performed along either of a column direction of the first LDPC characteristic matrix and a column direction of the second LDPC characteristic, the first set of error correction configuring parameters comprises a number of non-zero sub-matrices in each column of the first LDPC characteristic matrix, and the second set of error correction configuring parameters comprises a number of non-zero sub-matrices in each column of the second LDPC characteristic matrix.

11. A memory apparatus, comprising:
at least one non-volatile (NV) memory element, each comprising a plurality of blocks; and
a controller, arranged to control the at least one non-volatile memory element, the controller comprising a processing unit so as to manage the memory apparatus according to a program code embedded in the processing unit or received from outside of the processing unit, wherein the controller reads encoded data of a second set of error correction configuring parameters from a system block of a specific non-volatile memory element within the at least one non-volatile memory element, and utilizes a low-density parity-check engine in the controller to decode the encoded data to obtain the second set of error correction configuring parameters, wherein the LDPC engine stores a first set of error correction configuring parameters, and during decoding the encoded data, the LDPC engine performs decoding corresponding to a first LDPC characteristic matrix based on the first set of error correction configuring parameters; and the controller stores the second set of error correction configuring parameters obtained by decoding the encoded data into a random access memory (RAM) in the LDPC engine, and controls the LDPC engine to perform operations corresponding to a second LDPC characteristic matrix based on the second set of error correction configuring parameters in the RAM, in order to make the LDPC engine be equipped with encoding and decoding capabilities corresponding to the second LDPC characteristic matrix, for allowing the controller to access data in the at least one non-volatile memory element;

wherein the first LDPC characteristic matrix comprises a plurality of sub-matrices, and each of the plurality of sub-matrices of the first LDPC characteristic matrix is a square matrix selected from a predetermined set; the second LDPC characteristic matrix comprises a plurality of sub-matrices, and each of the plurality of sub-matrices of the second LDPC characteristic matrix is a square matrix selected from the predetermined set;

a size of any sub-matrix within the plurality of sub-matrices of the second LDPC characteristic matrix is equal to a size of any sub-matrix within the plurality of sub-matrices of the first LDPC characteristic matrix; and the predetermined set comprises a zero matrix, an identity matrix, and at least one cyclic-shifted matrix of the identity matrix, wherein any cyclic-shifted matrix within the at least one cyclic-shifted matrix is obtained by cyclically shifting all column vectors in the identity matrix, or by cyclically shifting all row vectors in the identity matrix.

12. The memory apparatus of claim 11, wherein a number of sub-matrices of the second LDPC characteristic matrix arranged along a column direction is smaller than a number of sub-matrices of the first LDPC characteristic matrix arranged along the column direction; and a number of sub-matrices of the second LDPC characteristic matrix arranged along a row direction is smaller than a number of sub-matrices of the first LDPC characteristic matrix arranged along the row direction.

13. The memory apparatus of claim 11, wherein the encoded data is generated in advance by performing encoding to the second set of error correction configuring parameters based on the first set of error correction configuring parameters; and the encoded data is written into the system block in advance.

14. The memory apparatus of claim 11, wherein when the memory apparatus is powered on, the controller reads the encoded data from the system block and utilizes the LDPC engine to decode the encoded data to obtain the second set of error correction configuring parameters, to allow the LDPC engine to perform operations corresponding to the second LDPC characteristic matrix based on the second set of error correction configuring parameters in the RAM.

15. The memory apparatus of claim 14, wherein when the memory apparatus is powered off, the second set of error correction configuring parameters in the RAM is lost, causing the LDPC engine to temporarily lose encoding ability and decoding ability corresponding to the second LDPC characteristic matrix, until the memory apparatus is powered on again.

16. A controller of a memory apparatus, the memory apparatus comprising at least one non-volatile (NV) memory element, each comprising a plurality of blocks, the controller comprising:

a low-density parity-check (LDPC) engine, arranged to perform error correction for the controller, wherein the LDPC engine comprises a hardware circuit; and a processing unit, coupled to the LDPC engine, the processing unit arranged to manage the memory apparatus according to a program code embedded in the processing unit or received from outside of the processing unit, wherein the controller reads encoded data of a second set of error correction configuring parameters from a system block of a specific non-volatile memory element within the at least one non-volatile memory element, and utilizes the LDPC engine to decode the encoded data to obtain the second set of error correction configuring parameters, wherein the LDPC engine stores a first set of error correction configuring parameters, and during decoding the encoded data, the LDPC engine performs decoding corresponding to a first LDPC characteristic matrix based on the first set of error correction configuring parameters; and the controller stores the second set of error correction configuring parameters obtained by decoding the encoded data into a random access memory (RAM) in the LDPC engine, and controls the LDPC engine to perform operations corresponding to a second LDPC characteristic matrix based on the second set of error correction configuring parameters in the RAM, in order to make the LDPC engine be equipped with encoding and decoding capabilities corresponding to the second LDPC characteristic matrix, for allowing the controller to access data in the at least one non-volatile memory element;

wherein the first LDPC characteristic matrix comprises a plurality of sub-matrices, and each of the plurality of sub-matrices of the first LDPC characteristic matrix is a square matrix selected from a predetermined set; the second LDPC characteristic matrix comprises a plurality of sub-matrices, and each of the plurality of sub-matrices of the second LDPC characteristic matrix is a square matrix selected from the predetermined set;

a size of any sub-matrix within the plurality of sub-matrices of the second LDPC characteristic matrix is equal to a size of any sub-matrix within the plurality of sub-matrices of the first LDPC characteristic matrix; and the predetermined set comprises a zero matrix, an identity matrix, and at least one cyclic-shifted matrix of the identity matrix, wherein any cyclic-shifted matrix within the at least one cyclic-shifted matrix is obtained by cyclically shifting all column vectors in the identity matrix, or by cyclically shifting all row vectors in the identity matrix.

17. The controller of claim 16, wherein a number of sub-matrices of the second LDPC characteristic matrix arranged along a column direction is smaller than a number of sub-matrices of the first LDPC characteristic matrix arranged along the column direction; and a number of sub-matrices of the second LDPC characteristic matrix arranged along a row direction is smaller than an amount of sub-matrices of the first LDPC characteristic matrix arranged along the row direction.

18. The controller of claim 16, wherein the encoded data is generated in advance by performing encoding to the second set of error correction configuring parameters based on the first set of error correction configuring parameters; and the encoded data is written into the system block in advance.

19. The controller of claim 16, wherein when the memory apparatus is powered on, the controller reads the encoded data from the system block and utilizes the LDPC engine to decode the encoded data to obtain the second set of error correction configuring parameters, to allow the LDPC engine to perform operations corresponding to the second LDPC characteristic matrix based on the second set of error correction configuring parameters in the RAM.

20. A method for controlling a memory apparatus, the memory apparatus comprising at least one non-volatile (NV) memory element, each comprising a plurality of blocks, the method applied to an initialization apparatus, so as to utilize a controller in the memory apparatus to perform initialization to the memory apparatus, the controller arranged to control the at least one non-volatile memory element, the method comprising following steps:

writing encoded data of a second set of error correction configuring parameters into a system block of a specific non-volatile memory element within the at least one non-volatile memory element, wherein the encoded data is generated in advance by performing encoding to the second set of error correction configuring parameters based on the first set of error correction configuring parameters;
   utilizing the controller to read the encoded data of the second set of error correction configuring parameters from the system block of the specific non-volatile memory element, and utilizing a low-density parity-check (LDPC) engine in the controller to decode the encoded data to obtain the second set of error correction configuring parameters, wherein the LDPC engine stores the first set of error correction configuring parameters, and during decoding the encoded data, the LDPC engine performs decoding corresponding to a first LDPC characteristic matrix based on the first set of error correction configuring parameters; and
   utilizing the controller to store the second set of error correction configuring parameters obtained by decoding the encoded data into a random access memory (RAM) in the LDPC engine, and controlling the LDPC engine to perform operations corresponding to a second LDPC characteristic matrix based on the second set of error correction configuring parameters in the RAM, in order to make the LDPC engine be equipped with encoding and decoding capabilities corresponding to the second LDPC characteristic matrix, for allowing the controller to access data in the at least one non-volatile memory element during the initialization;
   wherein the first LDPC characteristic matrix comprises a plurality of sub-matrices, and each sub-matrix within the plurality of sub-matrices of the first LDPC characteristic matrix is a square matrix selected from a predetermined set;
   the second LDPC characteristic matrix comprises a plurality of sub-matrices, and each sub-matrix within the plurality of sub-matrices of the second LDPC characteristic matrix is a square matrix selected from a predetermined set;
   a size of any sub-matrix within the plurality of sub-matrices of the second LDPC characteristic matrix is equal to a size of any sub-matrix within the plurality of sub-matrices of the first LDPC characteristic matrix; and
   the predetermined set comprises a zero matrix, an identity matrix, and at least one cyclic-shifted matrix of the identity matrix, wherein any cyclic-shifted matrix within the at least one cyclic-shifted matrix is obtained by cyclically shifting all column vectors in the identity matrix, or by cyclically shifting all row vectors in the identity matrix.

* * * * *